(12) United States Patent
Terhune, IV

(10) Patent No.: US 8,834,192 B2
(45) Date of Patent: Sep. 16, 2014

(54) ELECTRICAL CONNECTOR WITH CARRIER FRAME LOADING ELECTRONIC PACKAGE

(71) Applicant: Hon Hai Precision Industry Co., Ltd., New Taipei (TW)

(72) Inventor: Albert Harvey Terhune, IV, Chandler, AZ (US)

(73) Assignee: Hon Hai Precision Industry Co., Ltd., New Taipei (TV)

( * ) Notice: Subject to any disclaimer, the term of this patent is extended or adjusted under 35 U.S.C. 154(b) by 59 days.

(21) Appl. No.: 13/647,350

(22) Filed: Oct. 8, 2012

(65) Prior Publication Data

US 2014/0099827 A1    Apr. 10, 2014

(51) Int. Cl.
*H01R 13/62* (2006.01)

(52) U.S. Cl.
USPC ............................................ 439/331; 439/73

(58) Field of Classification Search
USPC .............................. 439/331, 73, 330, 525, 526
See application file for complete search history.

(56) References Cited

U.S. PATENT DOCUMENTS

| | | | |
|---|---|---|---|
| 4,427,249 A * | 1/1984 | Bright et al. ..................... | 439/68 |
| 4,511,201 A * | 4/1985 | Baker et al. .................... | 439/260 |
| 4,980,635 A * | 12/1990 | Walton et al. ............ | 324/756.05 |
| 5,000,697 A * | 3/1991 | Murphy ........................ | 439/331 |
| 5,216,583 A * | 6/1993 | Katsumata ..................... | 361/760 |
| 5,241,453 A * | 8/1993 | Bright et al. ................... | 361/704 |
| 5,302,853 A * | 4/1994 | Volz et al. ...................... | 257/707 |
| 5,567,177 A * | 10/1996 | Foerstel et al. ............... | 439/526 |
| 6,334,786 B1 * | 1/2002 | Lee ................................ | 439/331 |
| 6,776,625 B2 * | 8/2004 | Ma .................................. | 439/73 |
| 6,971,902 B2 | 12/2005 | Taylor et al. | |
| 7,001,197 B2 | 2/2006 | Shirai et al. | |
| 8,052,429 B1 * | 11/2011 | Gattuso ........................... | 439/73 |
| 8,096,822 B2 * | 1/2012 | Chen et al. ..................... | 439/330 |
| 2009/0088015 A1 * | 4/2009 | Zheng et al. .................. | 439/331 |
| 2011/0104927 A1 * | 5/2011 | Wang et al. ................... | 439/330 |
| 2013/0171855 A1 * | 7/2013 | Hayakawa .................... | 439/331 |

* cited by examiner

*Primary Examiner* — Gary Paumen

(74) *Attorney, Agent, or Firm* — Wei Te Chung; Ming Chieh Chang

(57) ABSTRACT

An electrical connector for use with an electronic package, includes an insulative housing defining an upward facing cavity, a plurality of contacts disposed in the cavity of the insulative housing with contacts sections extending into the cavity, and a carrier frame mounted to the insulative housing and having a main body defining an opening for allowing part of the electronic package passing through the opening. The carrier frame assembles to the insulative housing having a preliminary alignment state and a final alignment state.

14 Claims, 6 Drawing Sheets

ELECTRICAL CONNECTOR WITH CARRIER FRAME LOADING ELECTRONIC PACKAGE

BACKGROUND OF THE INVENTION

1. Field of the Invention

The present invention relates to a electrical connector, and more particularly to the electrical connector having a carrier frame loading with an electronic package mounted to an insulative housing by straight downward moving so as to reduce damage to contacts assembled therein.

2. Description of Related Art

U.S. Pat. No. 7,001,197 issued to Shirai et al. on Feb. 26, 2006 discloses an electrical connector having an insulative housing with a plurality of contacts received therein. The contacts have mating portions extending beyond top surface of the insulative housing to contact with an electronic package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing.

However, the exposed flexible mating portions may be broken, bent, or otherwise deformed which results in misalignment of the mating portions with respect to the electronic package.

To overcome the problem which is said in above, U.S. Pat. No. 6,971,902 issued to Taylor et al. on Dec. 6, 2005 discloses an electrical connector. The electrical connector includes a socket housing holding an array of electrical contacts and a load plate rotatably coupled to the housing and rotatable between an open position and a closed position. The load plate includes a channel that is configured to receive an electronic package when the load plate is in the open position. The load plate loads the package into the housing as the load plate is rotated to the closed position. Because the load plate loading the package is rotatably assembled to the housing, so one part of the contacts will firstly contact with the package and the other part of the contacts will after contact with the package, that cause the first contacting part of contacts may be bent pin.

Therefore, an improved electrical connector is needed.

SUMMARY OF THE INVENTION

An object of the present invention is to provide an electrical connector having a carrier frame loading with an electronic package for reducing damage to contacts assembled in an insulative housing.

According to one aspect of the present invention, an electrical connector for use with an electronic package, comprises an insulative housing defining an upward facing cavity, a plurality of contacts disposed in the cavity of the insulative housing with contacts sections extending into the cavity, and a carrier frame mounted to the insulative housing and having a main body defining an opening for allowing part of the electronic package exposed therein. The carrier frame further includes latches to assemble with the inuslative housing and in that process the carrier frame has a preliminary alignment state, on that condition the main body of the carrier frame substantially horizontally stands on the insulative housing regard to a bottom surface of the cavity and can be further assembled to the insulative housing to a final alignment state by a small force. Wherein, the carrier frame will be straight downward moved from the pre-alignment state to the final alignment state.

According to another aspect of the present invention, an electrical connector assembly for use with an electronic package, comprises an insulative housing defining an upward facing cavity; a plurality of contacts disposed in the cavity of the insulative housing with contacts sections extending into the cavity; a carrier frame having a main body defining an opening to allow a part of the electronic package passing through the opening and another part of the electronic package mounted on a bottom surface of the main body. The carrier frame assembles to the inuslative housing has a preliminary alignment state and a final alignment state. Wherein, on the pre-alignment state, the electronic package has a same distance with a bottom surface of the cavity and does not contact with the contacts in the insulative housing, and the carrier frame has a plurality of latches all engaging with the insulative housing; and on the final alignment state, the electronic package engages with the contacts and the latches of the carrier frame are locked by the insulative housing.

Other objects, advantages and novel features of the invention will become more apparent from the following detailed description of a preferred embodiment when taken in conjunction with the accompanying drawings.

DETAILED DESCRIPTION OF THE INVENTION

Figure 1:
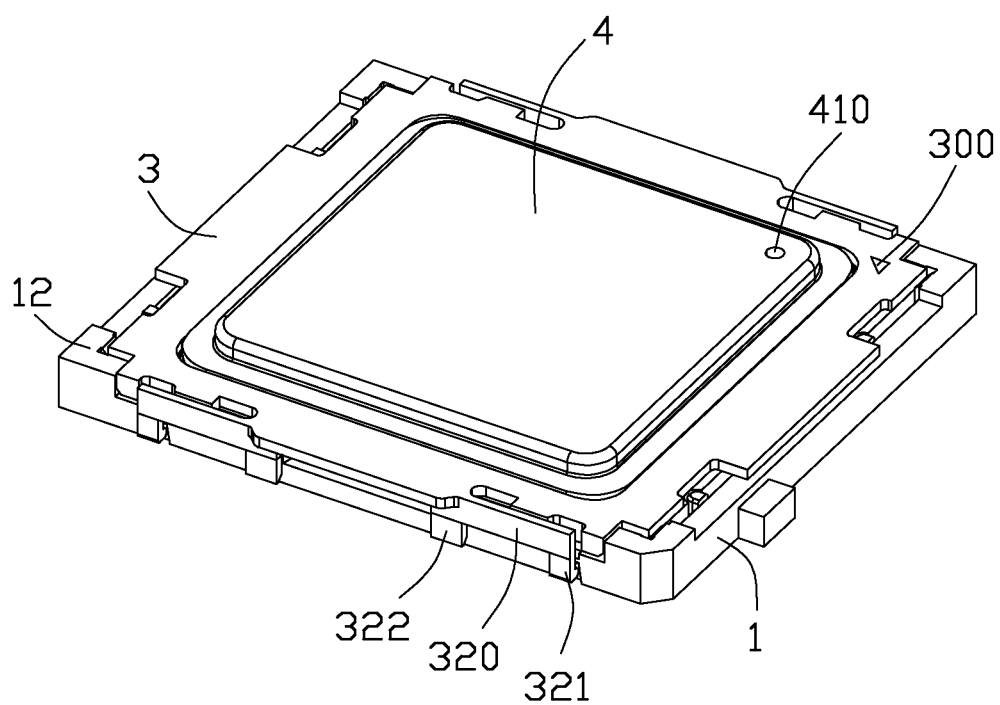
FIG. 1 is an assembled, perspective view of an electrical connector with an electronic package in accordance with the present invention.
Figure 2:
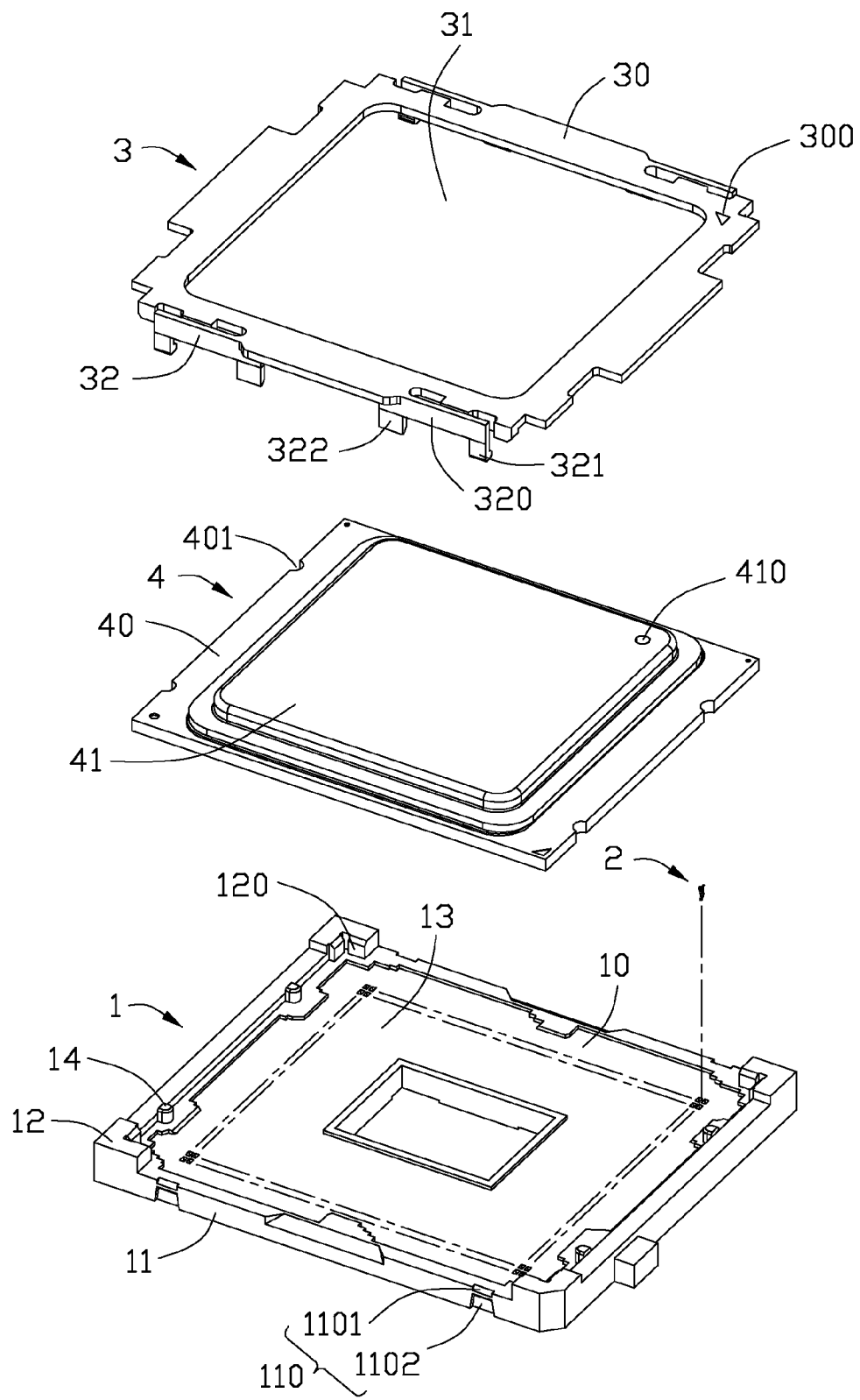
FIG. 2 is an exposed view of the electrical connector and the electronic package shown in FIG. 1.

Referring to FIGS. 1 and 2, an electrical connector used for electrically connecting an electronic package 4 and a printed circuit board (PCB, not shown), comprises an insulative housing 1 with a plurality of contacts 2, a carrier frame 3 mounted to the insulative housing 1. The electronic package 4 includes a substrate 40 made with insulative material and a die 41 extending higher than the substrate 40.

The insulative housing 1 includes a base 10 for receiving the contacts 2. A plurality of sidewalls 11 defined by the base 10 has receiving portions 110 thereon to engage with the carrier frame 3. Each receiving portion 110 includes a chamfer 1101 located at top of the sidewall 11 and a recess 1102 located corresponding to the chamfer 1101 and lower than the chamfer 1101 at an up-to-down direction. Four bulges 120 protrude from corners of the base 10 and define a plurality of datums 120 to define a cavity 13 for receiving the electronic package 4. The contacts 2 are disposed in the cavity 13 of the insulative housing 1 with contacts sections extending into the cavity 13. The datums 120 is used to engage with edges of the substrate 40 of the electronic package 4 for the electronic package 4 to be mounted to the insulative housing 1. A plurality of aligned keys 14 defined on two opposite sides of the base 10 extend inwardly to the cavity 13 for cooperating with cutouts 401 of the electronic package 4 to be correctly mounted to the cavity 13.

Figure 3:
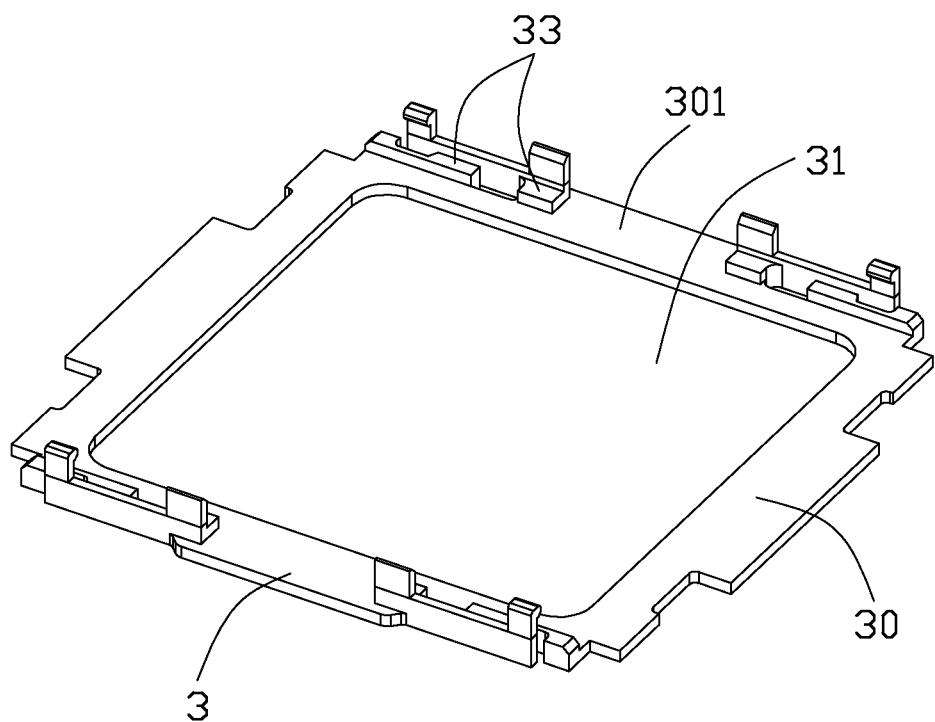
FIG. 3 is a bottom, perspective view of a carrier frame of the electrical connector.

Referring to FIGS. 2 and 3, the carrier frame 3 includes a substantially planar main body 30 and an opening 31 formed at a center of the main body 30. Four latches 32 are disposed on two opposite sides of the main body 30 for mating with the sidewalls 11 of the insulative housing 1. Each latch 32 defines an extending arm 320 extending horizontally along an edge of the main body 30. A hook 321 and an alignment beam 322 extend downwardly from the extending arm 320, respectively. The hook 321 moves downwardly through the chamfer 1101 and is secured in the recess 1102 for assembling the carrier frame 3 to the insulative housing 1. The alignment beam 322 moves downwardly along the sidewall 11 of the insulative housing 1 for leading the hook 321 moving. A number of restrict portions 33 protrude from a bottom surface 301 of the main body 30 for engaging with the edges of the substrate 40 to position the electronic package 4 to the carrier frame 3. A corner of the main body 30 defines an indicator 300 to work with a hole 410 of the die 41 of the electronic package 4 for correctly assembling the electronic package 4 to the opening 31 of the carrier frame 3.

Figure 4:
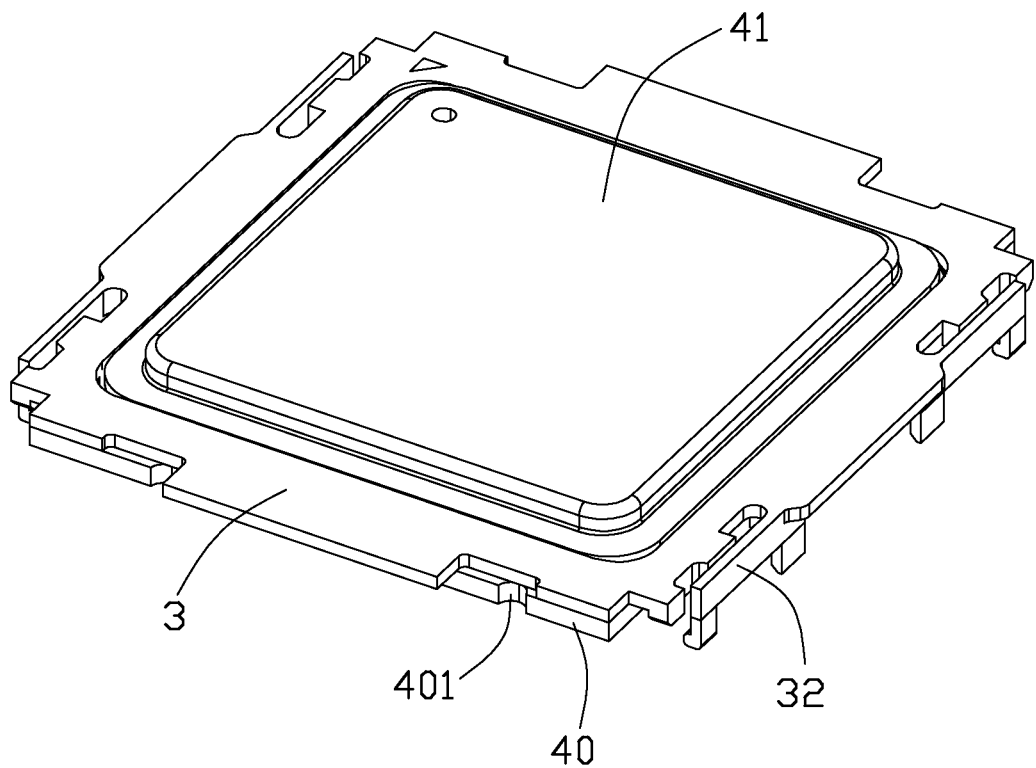
FIG. 4 is a top, perspective view of a carrier frame assembled with the electronic package.
Figure 5:
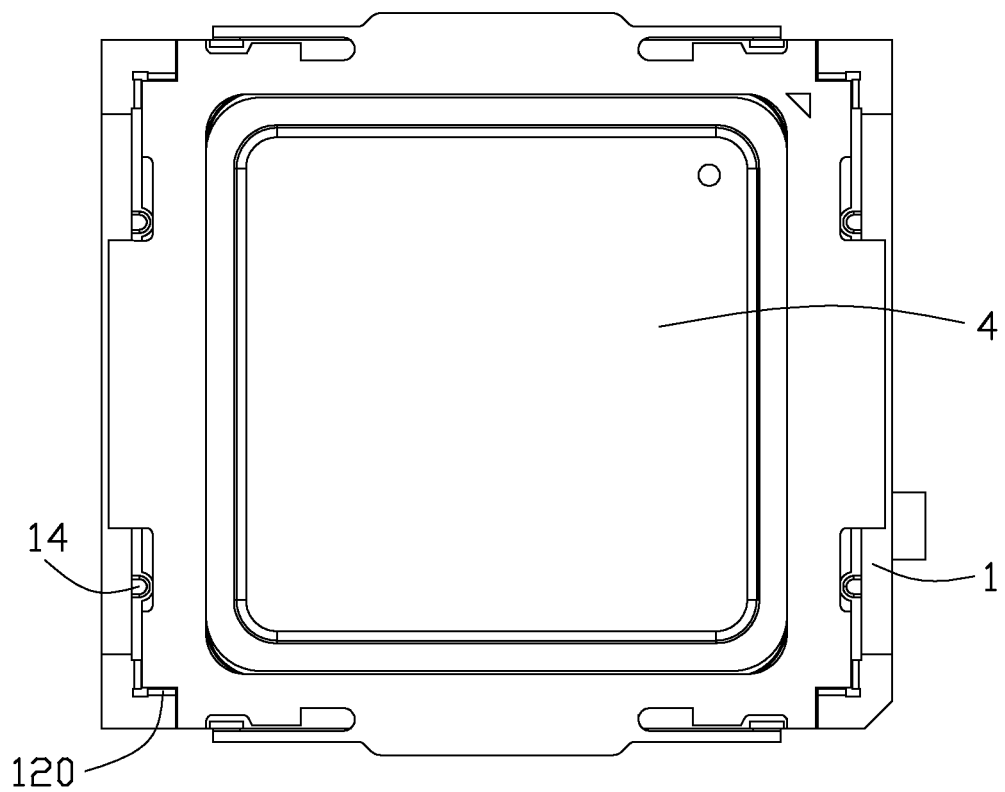
FIG. 5 is a top view of the electrical connector with the electronic package showed in FIG. 1.

Referring to FIGS. 3 to 5, the carrier frame 3 is mated to the electrical package 4 by way of the opening 31, concretely, the main body 30 of the carrier frame 3 has a layer of adhesive on the bottom surface 301 thereof, the substrate 40 is adhibited on the bottom surface 301 and the die 41 is passed through the opening 31 of the carrier frame 3. Understandably, other means such as minor resilient arms grasping a periphery of the electronic package for temporary retention of the electronic package to the carrier frame is also applicable prior to final or complete assembling of the carrier frame with the associated electronic package to the housing.

Figure 6:
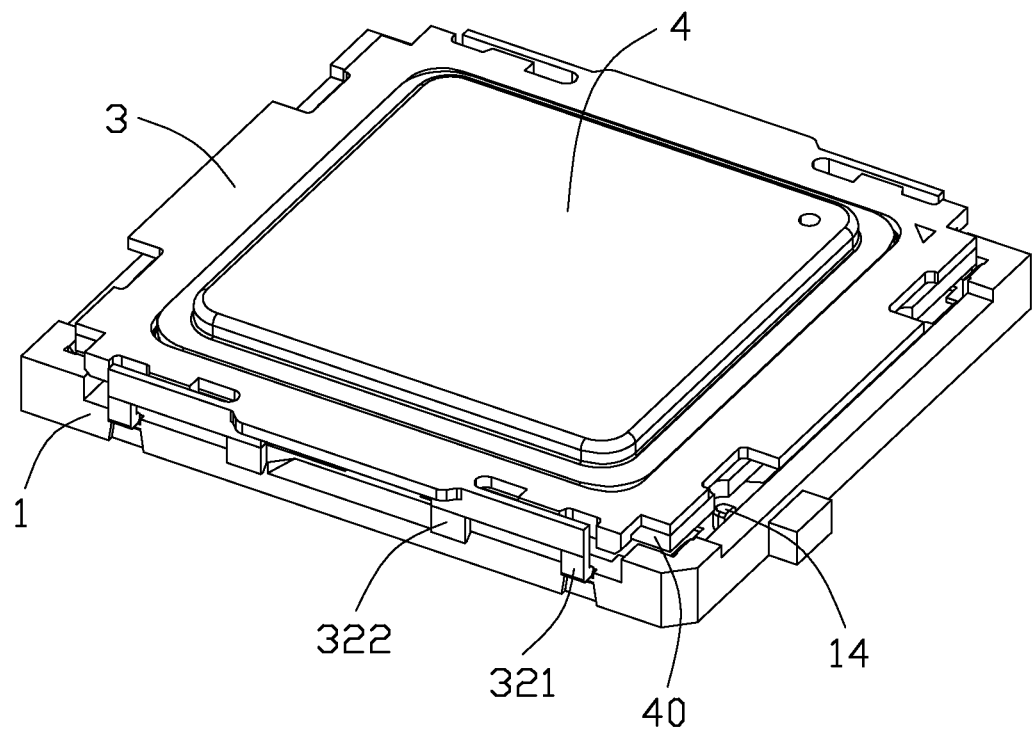
FIG. 6 is a pre-alignment state of electronic package assembled to the electrical connector.

FIG. 6 shows a preliminary state that the carrier frame 3 loads the electronic package 4 preparing to assemble to the insulative housing 1. The hooks 321 and the alignment beams 320 of the carrier frame 3 provide additional preliminary alignment to the chamfers 1101 and the sidewalls 11 of the insulative housing 1 to make the carrier frame 3 to stand on the insulative housing 1. On that condition, the electronic package 4 doesn't enter into the insulative housing 1 or contacts with the datums 120 and contacts 2 so that can prevent damage to the datums 120 and contacts 2. Furthermore, if an operator decides to not push the carrier frame 3 down, it can be left in its preliminary state on the insulative housing 1, the loading mechanism, for example, a lever, a loading plate, and a stiffener (not shown), which can apply an enabling loading force onto the electronic package 4 to push the carrier frame 3 downwardly engaging with the receiving portion 110.

In the instant invention, the carrier frame 3 loading the electronic package 4 mounted to the insulative housing 1 has a preliminary alignment state and a final alignment state. On the preliminary alignment state, the latches 32 engage with the insulative housing 1, the main body 30 of the carrier frame 3 and electronic package 4 parallel to the base 10 or a bottom surface of the cavity 13. On the final alignment state, the electronic package 4 engages with the contacts 2, and the latches 32 of the carrier frame 3 are locked by the recesses 1102 of insulative housing 1. The carrier frame 3 loading the electronic package 4 straight downward moves to the insulative housing 1 from the preliminary alignment state to the final alignment state, and when the carrier frame 3 loading the electronic package 4 in the final alignment state, the carrier frame 3 doesn't need to remove from the insulative housing 1.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for use with an electronic package, comprising:
    an insulating housing defining an upward facing cavity;
    a plurality of contacts disposed in the cavity of the insulating housing with contacting sections extending into the cavity;
    a carrier frame mounted to the insulating housing and having a main body defining an opening for allowing part of the electronic package passing through the opening, the carrier frame further including latches to assemble with the insulating housing and in that process the carrier frame has a preliminary alignment state, on that condition the main body of the carrier frame substantially horizontally stands on the insulating housing with regard to the cavity and can be further assembled to the insulating housing to a final alignment state by a small force; and wherein
    the carrier frame is configured to be straight downward moved from the preliminary alignment state to the final alignment state.

2. The electrical connector as claimed in claim 1, wherein each latch defined on the main body includes an extending arm extending along an edge of the main body of the carrier frame, and a hook and an alignment beam extending downward from the extending arm.

3. The electrical connector as claimed in claim 2, wherein a plurality of receiving portions are defined on sidewalls of the insulating housing, each receiving portion includes a recess located at the sidewall to lock the hook of the carrier frame and a chamfer located corresponding to the recess to lead the hook moving, and wherein the chamfer is higher than the hook at an up-to-down direction.

4. The electrical connector as claimed in claim 3, wherein the hooks and the alignment beams of the carrier frame provide additional preliminary alignment to the chamfers and sidewalls of the insulating housing, respectively.

5. An electrical connector assembly for use with an electronic package, comprising:
    an insulating housing defining an upward facing cavity;
    a plurality of contacts disposed in the cavity of the insulating housing with contacting sections extending into the cavity;
    a carrier frame having a main body defining an opening to allow a part of the electronic package exposed therein and another part of the electronic package mounted on a bottom surface of the main body, the carrier frame assembling to the insulating housing having a preliminary alignment state and a final alignment state; and wherein
    in the preliminary alignment state, the electronic package is parallel to a bottom surface of the cavity and does not contact with the contacts in the insulating housing, and the carrier frame has a plurality of latches all loosely engaging with the insulating housing; and
    in the final alignment state, the electronic package is contacted with the contacts, and the latches of the carrier frame are firmly locked by the insulating housing.

6. The electrical connector assembly as claimed in claim 5, wherein each latch includes an extending arm extending along an edge of the main body of the carrier frame, and a hook and an alignment beam extending downward from the extending arm.

7. The electrical connector assembly as claimed in claim 6, wherein a plurality of receiving portions are defined on sidewalls of the insulating housing, each receiving portion includes a recess located at the sidewall to lock the hook of the carrier frame and a chamfer located corresponding to the recess and higher than the hook at an up-to down direction.

8. The electrical connector assembly as claimed in claim 7, wherein the hooks engage with the chamfers and the alignment beams engage with the sidewalls of the insulating housing to provide force to the carrier frame loading with the electronic package on the preliminary alignment state.

9. The electrical connector assembly as claimed in claim 8, wherein the electronic package is attached to the bottom of the main body of the carrier frame.

10. An electrical connector assembly for use with an electronic package, comprising:
   an insulating housing defining a receiving cavity in an upper face;
   a plurality of contacts disposed in the housing with contacting sections upwardly exposed in the receiving cavity;
   a carrier frame discrete from and completely removable from the housing, said carrier frame defining a main body with an opening therein for downwardly abutting against side regions of the electronic package while being configured to be large enough to have a center die of the electronic package extend upwardly through the opening for heat transfer with a heat sink; wherein
   said carrier frame is configured to have the electronic package attached to an undersurface thereof in an associative manner;
   said carrier frame defines an upper temporary holding position with regard to the housing where the carrier with the associated electronic package is in a loose state with regard to the housing and the associated contacts for being ready to mate, and a lower final holding position with regard to the housing where the carrier with the associated electronic package is in a firm state with regard to the housing and the associated contacts for being completely mated.

11. The electrical connector assembly as claimed in claim 10, wherein one of said housing and said carrier frame includes a resilient latch, and the other of said housing and said carrier frame includes upper and lower locking recesses to cooperate with said resilient latch to determine said upper temporary holding position and said lower final holding position.

12. The electrical connector assembly as claimed in claim 10, wherein said carrier frame is configured to allow the electronic package to be attached thereto only in a vertical direction with regard to the main body.

13. The electrical connector assembly as claimed in claim 10, wherein said carrier frame and said housing are configured to allow said carrier frame to be assembled to the housing only in a vertical direction with regard to the housing.

14. The electrical connector assembly as claimed in claim 10, further including first alignment means formed on the housing and the carrier frame to align the carrier frame with the housing in a vertical direction during assembling, and a second alignment means formed on the housing and the electronic package to align the electronic package with the housing in the vertical direction.

* * * * *